United States Patent
Kim et al.

(10) Patent No.: US 8,587,096 B2
(45) Date of Patent: Nov. 19, 2013

(54) SEMICONDUCTOR DEVICE INCLUDING SHIELDING LAYER AND FABRICATION METHOD THEREOF

(75) Inventors: Yong-hoon Kim, Suwon-si (KR); Hee-seok Lee, Yongin-si (KR); Jin-Ha Jeong, Yongin-si (KR); Ji-hyun Lee, Seocho-gu (KR)

(73) Assignee: Samsung Electronics Co., Ltd., Gyeonggi-Do (KR)

(*) Notice: Subject to any disclaimer, the term of this patent is extended or adjusted under 35 U.S.C. 154(b) by 35 days.

(21) Appl. No.: 13/172,174

(22) Filed: Jun. 29, 2011

(65) Prior Publication Data

US 2012/0086109 A1  Apr. 12, 2012

(30) Foreign Application Priority Data

Oct. 7, 2010 (KR) .................. 10-2010-0097838

(51) Int. Cl.
*H01L 23/552* (2006.01)
(52) U.S. Cl.
USPC .................. 257/659; 257/774; 257/E23.114
(58) Field of Classification Search
USPC .................. 257/659, 774, E23.114
See application file for complete search history.

(56) References Cited

U.S. PATENT DOCUMENTS

| 6,348,738 B1* | 2/2002 | Dery et al. ............ 257/778 |
| 2004/0251522 A1 | 12/2004 | Legaspi et al. |
| 2008/0272477 A1* | 11/2008 | Do et al. ............ 257/686 |
| 2009/0014847 A1 | 1/2009 | Chen et al. |
| 2010/0295151 A1* | 11/2010 | Kurokawa ............ 257/531 |
| 2011/0140247 A1* | 6/2011 | Pagaila et al. ............ 257/659 |

FOREIGN PATENT DOCUMENTS

| KR | 20-0345144 | 3/2004 |
| KR | 20080023996 A | 3/2008 |

* cited by examiner

*Primary Examiner* — Tan N Tran
(74) *Attorney, Agent, or Firm* — Harness, Dickey & Pierce, P.L.C.

(57) ABSTRACT

Example embodiments relate to a semiconductor device. The semiconductor device may include a first semiconductor chip including a semiconductor substrate, a first through via that penetrates the semiconductor substrate, a second semiconductor chip stacked on one plane of the first semiconductor chip, and a shielding layer covering at least one portion of the first and/or second semiconductor chip and electrically connected to the first through via.

29 Claims, 14 Drawing Sheets

SEMICONDUCTOR DEVICE INCLUDING SHIELDING LAYER AND FABRICATION METHOD THEREOF

CROSS-REFERENCE TO RELATED APPLICATION

This application claims priority under 35 U.S.C. §119 to Korean Patent Application No. 2010-0097838, filed on Oct. 7, 2010 in the Korean Intellectual Property Office, the content of which is herein incorporated by reference in its entirety.

BACKGROUND

1. Field

Example embodiments of the present invention relate to a semiconductor device including a shielding layer and a fabrication method thereof.

2. Description of the Related Art

When a plurality of semiconductor devices are incorporated into an electronic device, electromagnetic interference (EMI) may be generated between the plurality of semiconductor devices. EMI signals emitted or transmitted from one semiconductor device may interfere in the operation of another adjacent semiconductor, thereby lowering the overall circuit performance and resulting in potential malfunctioning.

SUMMARY

Example embodiments of the present invention relate to a semiconductor device having improved operational reliability while reducing or minimizing the effect of EMI.

These and other objects of the present invention will be described in or be apparent from the following description of example embodiments.

According to example embodiments of the present invention, a semiconductor device may include a first semiconductor chip including a semiconductor substrate, a first through via that penetrates the semiconductor substrate, a second semiconductor chip stacked on one plane of the first semiconductor chip, and a shielding layer covering at least a portion of at least one of the first semiconductor chip and second semiconductor chip and electrically connected to the first through via.

According to example embodiments of the present invention, a semiconductor device may also include a carrier substrate, a first semiconductor chip including a semiconductor substrate mounted on the carrier substrate, first and second through vias penetrating the semiconductor substrate, a second semiconductor chip mounted on the first semiconductor chip and electrically connected to the second through via, and a shielding layer covering at least a portion of at least one of the carrier substrate, the first semiconductor chip, and the second semiconductor chip and electrically connected to the first through via, wherein the second semiconductor chip may be smaller than the first semiconductor chip, and the first through via may be disposed in a region not overlapped by the second semiconductor chip.

BRIEF DESCRIPTION OF THE DRAWINGS

The above and other features and advantages of example embodiments of the present invention will become more apparent when the following detailed description is read with reference to the attached drawings in which.

DETAILED DESCRIPTION

Figure 1A:
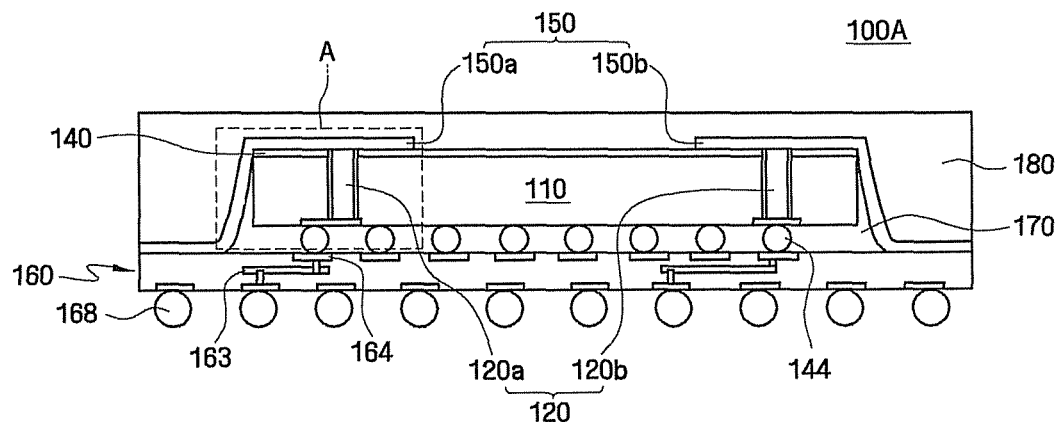
FIGS. 1A to 1D are a cross-sectional view and partially enlarged views of a semiconductor device according to example embodiments of the present invention.

Advantages and features of the present invention and methods of accomplishing the same may be understood more readily by referring to the following detailed description of example embodiments and the accompanying drawings. The present invention may, however, be embodied in many different forms and should not be construed as being limited to the examples set forth herein. Rather, the examples have merely been provided so that this disclosure will be thorough and complete and will fully convey the concept of the invention to those skilled in the art, with the scope of the present invention being defined by the appended claims. In the drawings, the thickness of various layers and/or regions may have been exaggerated for clarity. The use of similar or identical reference numbers in the various drawings is intended to indicate the presence of a similar or identical elements or features.

It will be understood that when an element or layer is referred to as being "on," or "connected to" another element or layer, it can be directly on or connected to the other element or layer or intervening elements or layers may be present. In contrast, when an element is referred to as being "directly on" or "directly connected to" another element or layer, there are no intervening elements or layers present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

As used herein, the singular fauns "a", "an" and "the" are intended to include the plural forms as well, unless the context clearly indicates otherwise. It will be further understood that the terms "includes," "including," "comprises," "comprising," and/or "made of," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs.

Hereinafter, example embodiments of the present invention will be described with reference to the accompanying drawings. Like numbers refer to like elements throughout. As used herein, the term "A or B" includes any and all combinations of one or more of the associated listed items, that is, A, B, and A and B.

Figure 1B:
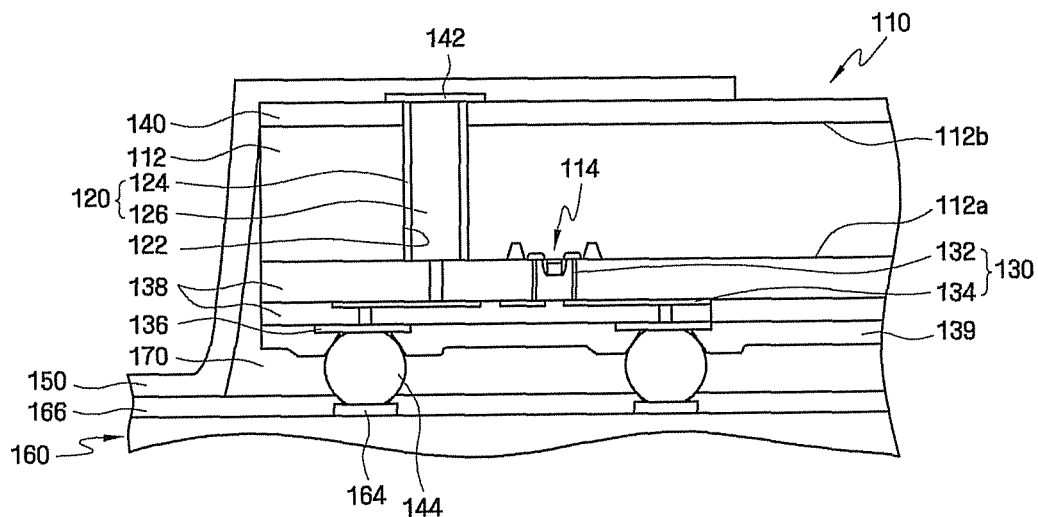
Figure 1C:
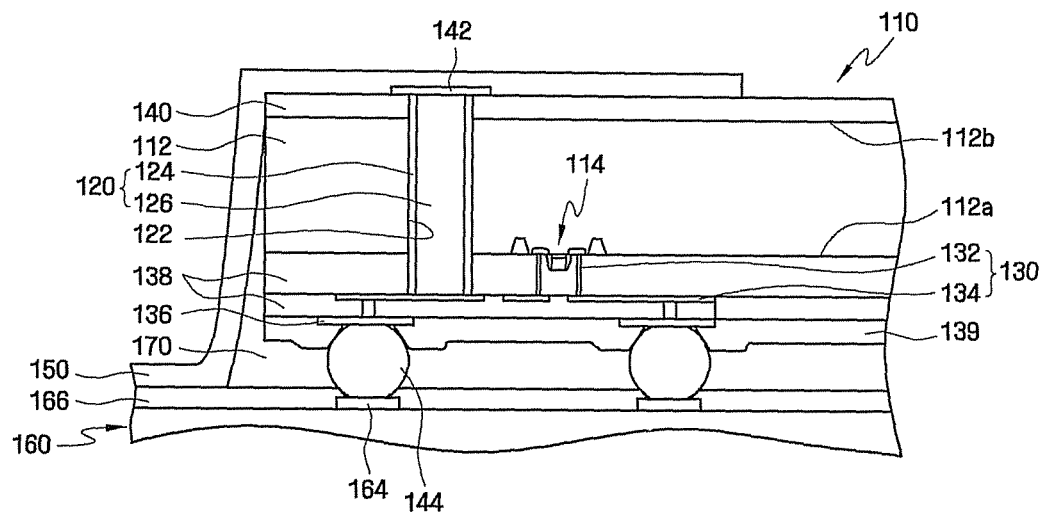
Figure 1D:
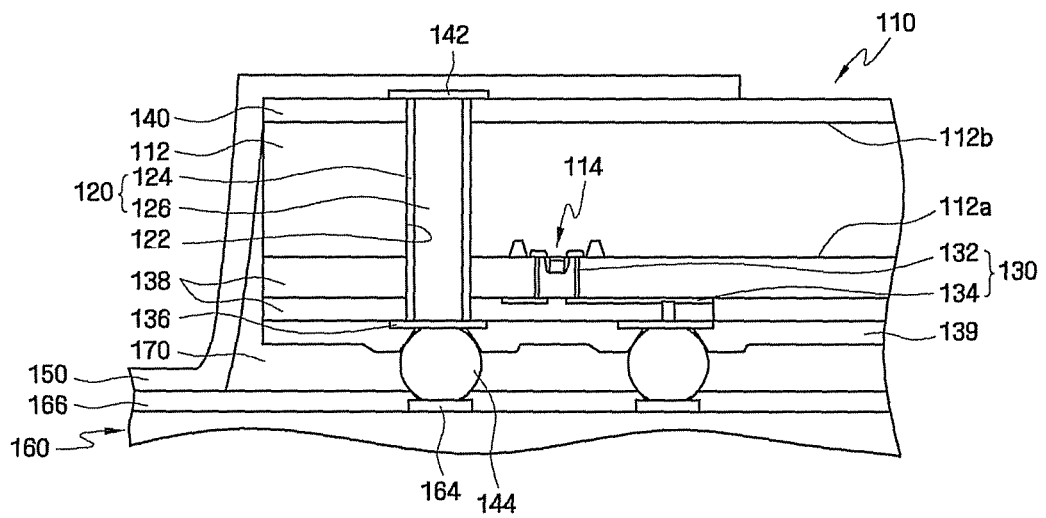

FIGS. 1A is a cross-sectional view of a semiconductor device according to example embodiments of the present invention, and FIGS. 1B to 1D are partially enlarged views of a semiconductor device according to example embodiments of the present invention. In particular, portion A of FIG. 1A may be varied as shown in the enlarged views illustrated in FIGS. 1B to 1D.

Referring to FIGS. 1A to 1D, a semiconductor device 100A may include a semiconductor chip 110 and a shielding layer 150 covering at least one surface of the semiconductor chip 110 and electrically connected to a through via 120.

The semiconductor chip 110 may include a semiconductor substrate 112, an integrated circuit 114 disposed on a surface of the semiconductor substrate 112, and a through via 120 that penetrates the semiconductor substrate 112.

The semiconductor substrate 112 may be, e.g., a silicon substrate, a silicon on insulator (SOI) substrate, or silicon germanium substrate, but is not limited thereto. The semiconductor substrate 112 may have a first surface 112a and a second surface 112b which is different from the first surface 112a. For example, the first surface 112a may be an active surface on which the integrated circuit 114 is disposed, and the second surface 112b may be a back surface which is opposed to the first surface 112a. Although not shown, the second surface 112b may be a side surface of the semiconductor substrate 112, at least one portion of which contacts the first surface 112a. The second surface 112b may not have a separate integrated circuit 114. If necessary, a redistribution layer (RDL) may be formed on the second surface 112b. Alternatively, a surface of the semiconductor substrate 112 may be exposed to the outside.

The integrated circuit 114 may include at least one of a memory circuit or a logic circuit. For example, the integrated circuit 114 may be a random access memory (RAM), a non-volatile memory, a memory control circuit, an application processor circuit, a power supplier circuit, a modem, and a radio frequency (RF) circuit.

The integrated circuit 114 may be connected to a chip pad 136, a through via 120, etc. through an internal wire pattern 130. The internal wire pattern 130 may include, for example, a contact via 132 and a wire pattern 134.

The integrated circuit 114 and the internal wire pattern 130 may be covered by an interlayer dielectric layer 138. The interlayer dielectric layer 138 may include a multi-layered insulation layer including an insulating material. A passivation layer 139 exposing the chip pad 136 may be disposed on the interlayer dielectric layer 138.

The through via 120 may include a via insulation layer 124 disposed on a wall surface of a via hole 122 that penetrates the semiconductor substrate 112, and a via electrode 126 disposed on the via insulation layer 124 and filling the via hole 122. The via insulation layer 124 may include a silicon oxide, and the via electrode 126 may include copper, but is not limited thereto. Although not shown, a barrier layer may be interposed between the via insulation layer 124 and the via electrode 126. The barrier layer may prevent a conductive material included in the via electrode 126 from being diffused into the semiconductor substrate 112. In a case where the via electrode 126 is formed by plating, a seed layer (not shown) may be interposed between the barrier layer and the via electrode 126.

The through via 120 may be formed in various types while penetrating at least a portion of the semiconductor chip 110. In the following description, the through via 120 formed in various types will be described with reference to FIGS. 1B to 1D. However, the types of the through via 120 are not limited to those illustrated herein.

Referring to FIG. 1B, the through via 120 may be formed in a via first type. Since the through via 120 is fowled prior to forming the integrated circuit 114 and the internal wire pattern 130, the through via 120 may not penetrate the interlayer dielectric layer 138 while penetrating the semiconductor substrate 112. The through via 120 may be electrically connected to the integrated circuit 114 or the chip pad 136 through the internal wire pattern 130.

Referring to FIG. 1C, the through via 120 may be formed in a via middle type. The through via 120 may be formed in the course of forming the integrated circuit 114 and the internal wire pattern 130. The through via 120 may penetrate the semiconductor substrate 112 while penetrating at least a portion of the interlayer dielectric layer 138. The through via 120 may be electrically connected to the integrated circuit 114 or the chip pad 136 through the internal wire pattern 130.

Referring to FIG. 1D, the through via 120 may be formed in a via last type. The through via 120 may be formed after forming the integrated circuit 114 and the internal wire pattern 130. The through via 120 may penetrate the semiconductor substrate 112 and the interlayer dielectric layer 138. The through via 120 may be directly connected to the chip pad 136 or may be connected to the chip pad 136 through a redistribution layer (not shown).

Referring again to FIGS. 1A to 1D, a back surface insulation layer 140 exposing the through via 120 may be disposed on the second surface 112b of the semiconductor substrate 112. In the course of forming the through via 120, the back surface insulation layer 140 may prevent the semiconductor substrate 112 from being contaminated with a conductive material. The back surface insulation layer 140 may be formed of a plurality of insulation layers. For example, the back surface insulation layer 140 may include at least one of silicon oxide, silicon nitride, silicon oxynitride. A connection pad 142 may be formed on one plane of the through via 120 exposed by the back surface insulation layer 140. The connection pad 142 may be connected to the via electrode 126 and may extend to be connected to a redistribution layer (not shown) formed on the second surface 112b.

The shielding layer 150 has a conductive property and is electrically connected to the through via 120 to receive a ground voltage from the through via 120, thereby reducing or minimizing the effect of EMI. As shown, the shielding layer 150 may cover at least one portion of the semiconductor chip 110.

In detail, the shielding layer 150 may remove an interference signal generated from the semiconductor chip 110, may prevent the generated interference signal from being released to the outside, or may prevent an external interference signal from affecting the semiconductor chip 110. The shielding layer 150 receives the ground voltage through the through via 120 and prevents the interference signal from being released to the outside. In a case where the semiconductor chip 110 includes a plurality of through vias 120a and 120b, the shielding layer 150 may be electrically connected to one of the through vias 120a and 120b. For example, the first shielding layer 150a may be connected to the first through via 120a, and the second shielding layer 150b may be connected to the second through via 120b. In order to prevent noises from being generated, the first ground voltage and the second ground voltage are electrically separated from each other when supplied to the semiconductor chip 110. The first ground voltage is supplied to the first shielding layer 150a through the first through via 120a, and the second ground voltage is supplied to the second shielding layer 150b through the second through via 120b. The first shielding layer 150a and the second shielding layer 150b may be electrically insulated from each other. For example, the first ground voltage may be a digital ground voltage, and the second ground voltage may be an analog ground voltage. Alternatively, the first ground voltage may be a signal line ground voltage, and the second ground voltage may be a power line ground voltage.

As described above, the shielding layer 150 may have a conductive property. For example, the shielding layer 150 may include a soft ferrite material, a ferrite material, a carbon nano tube (CNT), or a metallic material. The soft ferrite material may be soft ferrite metal powder or soft ferrite alloy powder, and may include a ferrite material. The ferrite material may include iron oxide such as FeO, $Fe_2O_3$, $Fe_2O_4$, or $Fe_3O_4$ and at least one metal. The metal combined with the iron oxide may include, for example, nickel (Ni), zinc (Zn), manganese (Mn), cobalt (Co), magnesium (Mg), aluminum (Al), barium (Ba), copper (Cu), iron (Fe) and so on. The ferrite material has a relatively high intrinsic resistivity and may have a relatively low level of saturated magnetization. In addition, since the ferrite material has relatively low mechanical strength, it can be combined with a metal to facilitate its use. The soft ferrite material may be continuously or discontinuously arranged within the shielding layer 150.

The semiconductor chip 110 may be mounted on the carrier substrate 160. The carrier substrate 160 may include a circuit pattern 163 connected to the semiconductor chip 110. The semiconductor chip 110 may be electrically connected to the outside of the semiconductor device 100A through the circuit pattern 163. For example, the carrier substrate 160 may be a printed circuit board (PCB) having the circuit pattern 163 formed therein, or a film substrate. The carrier substrate 160 may further include a connection means 168 for connecting the semiconductor device 100A to an external device. For example, in a case where the carrier substrate 160 is a package substrate, the semiconductor device 100A may be mounted on a set board (not shown) through the connection means 168. Alternatively, the carrier substrate 160 may be a system board (see 1010 of FIG. 12). In a case where the semiconductor chip 110 is a wafer level package (WLP), the semiconductor chip 110 may be mounted on the system board 1010 without a separate package substrate.

At least one portion of the carrier substrate 160 may be covered by the shielding layer 150. Since the shielding layer 150 covers at least one portion of the carrier substrate 160, the interference signal released through the carrier substrate 160 may be blocked or reduced. For example, the shielding layer 150 may cover one plane of the carrier substrate 160, where the semiconductor chip 110 is mounted.

The semiconductor chip 110 may be electrically connected to the carrier substrate 160 through the conductor means 144. For example, the conductor means 144 may include one selected from the group consisting of a conductive bump, a conductive spacer, a solder ball, a pin grid array (PGA) and combinations thereof. The carrier substrate 160 may include a bonding pad 164 formed on its one plane, the bonding pad 164 connected to the circuit pattern 163. The semiconductor chip 110 may be connected to the circuit pattern 163 through the conductor means 144 and the bonding pad 164. The carrier substrate 160 may further include solder resist (SR) 166 covering at least one portion of the carrier substrate 160 while exposing the bonding pad 164.

A passivation member 170 may be formed between the semiconductor chip 110 and the carrier substrate 160. The passivation member 170 may cover at least one portion of side surfaces of the semiconductor chip 110. For example, the passivation member 170 may cover all of the side surfaces of the semiconductor chip 110 and may contact the back surface insulation layer 140. The passivation member 170 may serve to protect the conductor means 144 or the semiconductor chip 110 from external moisture and to fix the semiconductor chip 110 on the carrier substrate 160. The passivation member 170 may include, for example, an underfill material.

The semiconductor device 100A may further include a molding portion 180 covering at least one portion of the semiconductor chip 110. The molding portion 180 may cover at least one portion of each of the shielding layer 150 and the carrier substrate 160. The molding portion 180 may serve to protect the semiconductor chip 110 and/or the shielding layer 150 from external moisture or impacts. The molding portion 180 may include, for example, an epoxy molding compound (EMC).

Figure 2:
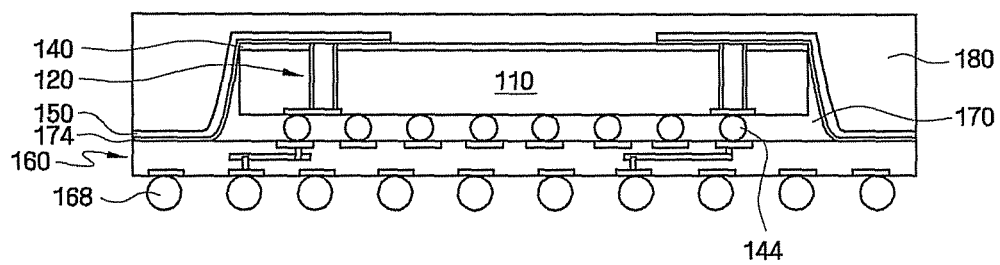
FIGS. 2 to 5 are cross-sectional views of semiconductor devices according to example embodiments of the present invention.

FIG. 2 is a cross-sectional view of a semiconductor device (100B) according to example embodiments of the present invention.

Referring to FIG. 2, in a case where a shielding layer 150 is supplied in a tape or can type, a semiconductor chip 110 and the shielding layer 150 may be adhered to each other using an adhesive layer 174. The adhesive layer 174 may include a conductive film and may electrically connect a through via 120 to the shielding layer 150. Alternatively, the adhesive layer 174 may include an insulating film and may have an opening (not shown) to allow the through via 120 and the shielding layer 150 to be electrically connected to each other.

Figure 3A:
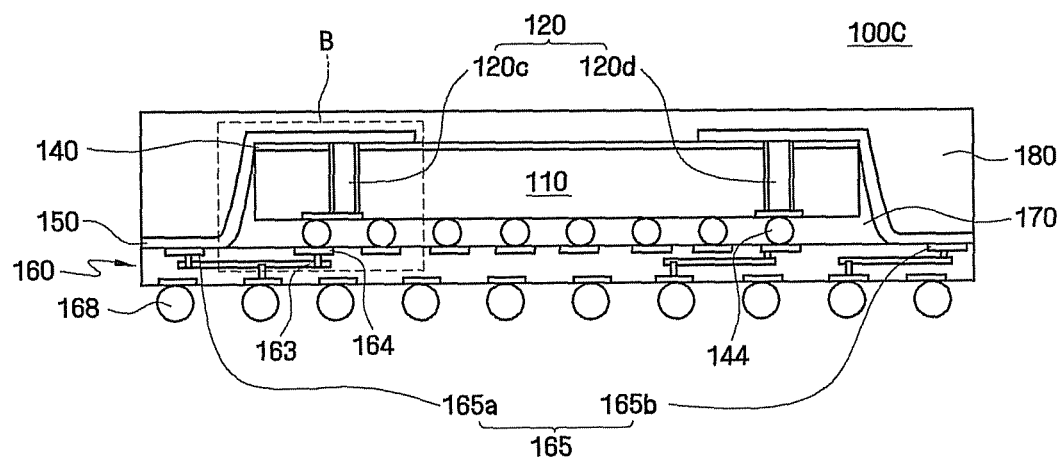
Figure 3B:
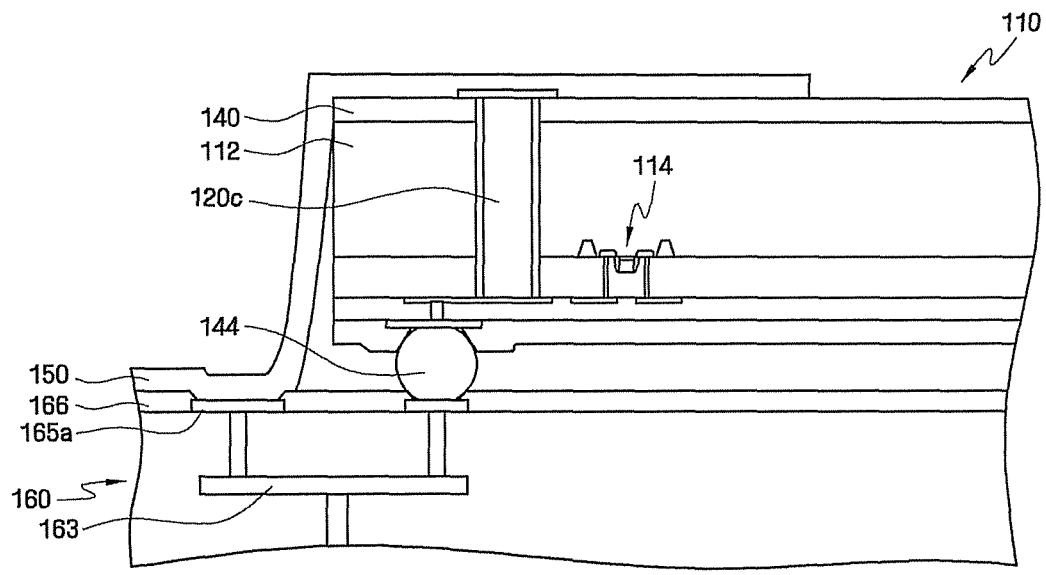

FIG. 3A is a cross-sectional view of a semiconductor device (100C) according to example embodiments of the present invention, and FIG. 3B is an exploded view of a portion B of FIG. 3A.

Referring to FIGS. 3A and 3B, a shielding layer 150 may be electrically connected to a carrier substrate 160. The carrier substrate 160 may include a bonding pad 164 for connecting a conductor means 144 and an additional bonding pad 165. The shielding layer 150 may directly contact the additional bonding pad 165 or may be electrically connected to the additional bonding pad 165. For example, the additional bonding pad 165 may be a ground pad. The shielding layer 150 may receive a ground voltage through the additional bonding pad 165.

The shielding layer 150 may be electrically connected to a through via 120 and the shielding layer 150. A through via 120c and the first additional bonding pad 165a may be electrically connected to each other through a circuit pattern 163 of the carrier substrate 160. Alternatively, the through via 120d and the second additional bonding pad 165b may be connected to the shielding layer 150, respectively, while being electrically insulated from each other. In another instance, the shielding layer 150 may be connected to the carrier substrate 160 while being electrically insulated from the through via 120.

Therefore, the semiconductor device according to example embodiments may be electrically connected to the through via 120 and the carrier substrate 160, thereby maintaining a constant voltage level in a relatively stable manner.

Figure 4:
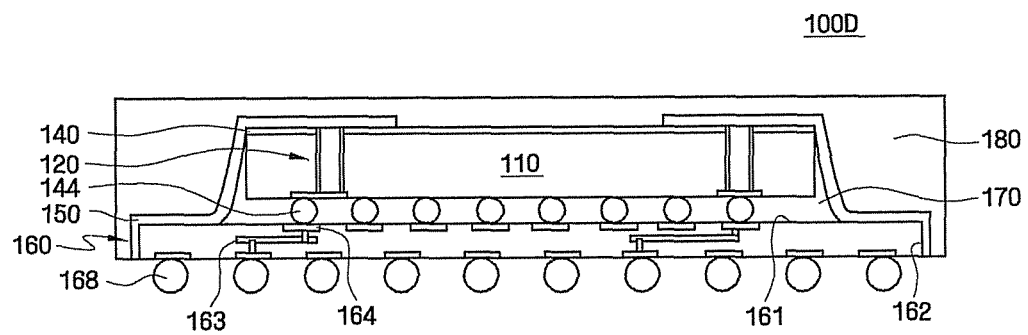

FIG. 4 is a cross-sectional view of a semiconductor device (100D) according to example embodiments of the present invention.

Referring to FIG. 4, the shielding layer 150 may cover a side surface 162 of a carrier substrate 160. The side surface 162 may be a plane perpendicularly connected to one plane 161 of the carrier substrate 160 where a semiconductor chip 110 is mounted. A molding portion 180 may extend to the side surface 162 of the carrier substrate 160, covering the shielding layer 150.

Since the shielding layer 150 covers the side surface 162 of the carrier substrate 160, EMI through the side surface 162 of the carrier substrate 160 may be prevented or reduced.

Figure 5:
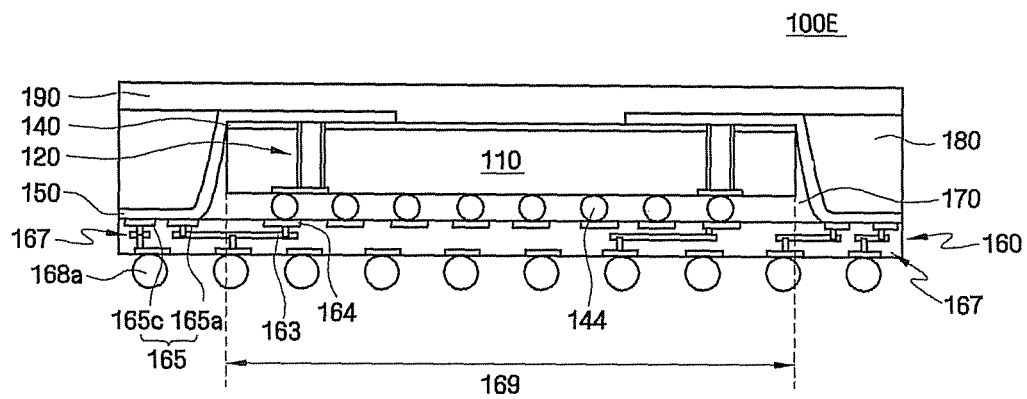

FIG. 5 is a cross-sectional view of a semiconductor device (100E) according to example embodiments of the present invention.

Referring to FIG. 5, a carrier substrate 160 may include a heat dissipating via 167. Heat generated during the operation of a semiconductor chip 110 may be emitted to the outside of the semiconductor device 100D through a conductor means 144 connected to the semiconductor chip 110. Additionally, the heat generated from the semiconductor chip 110 may be conducted through the shielding layer 150 to then be emitted to the outside of the semiconductor chip 110. The heat may be emitted to the outside of the semiconductor chip 110 through a through via 120 to be interconnected with the shielding layer 150 and the heat dissipating via 167. Since the shielding layer 150 includes a conductive material, it may have a relatively large thermal conductivity compared to a case where the heat is emitted through a molding portion 180.

The heat dissipating via 167 may be disposed outside a chip mounting regions 169. The chip mounting region 169 may be a partial region of the carrier substrate 160 where the semiconductor chip 110 is mounted. That is to say, the heat dissipating via 167 may be disposed in a region not overlapping the first semiconductor chip 110, so that it may not overlap the semiconductor chip 110. For example, the chip mounting region 169 may be a region where the carrier substrate 160 and the semiconductor chip 110 overlap each other, or a region where a bonding pad 164 is disposed. The heat dissipating via 167 may be connected to an additional bonding pad 165c, and may be simultaneously formed with the circuit pattern 163. For example, the heat dissipating via 167 may be connected to an additional bonding pad 165 or the bonding pad 164 through a circuit pattern 163. Alternatively, the heat dissipating via 167 may be insulated from the bonding pad 164 and may connect the connection means 168a and the additional bonding pad 165c to each other. The heat dissipating via 167 and the additional bonding pad 165c may be supplied with a ground voltage. The same ground voltage as the ground voltage supplied to the shielding layer 150 through the through via 120 may be supplied to the heat dissipating via 167. A plurality of heat dissipating vias 167 may be connected to the shielding layer 150.

The semiconductor device 100E may further include a heat sink 190. The heat sink 190 may include a material having a relatively high level of thermal conductivity. For example, the heat sink 190 may include a metal plate. The heat sink 190 may directly contact the shielding layer 150. In addition, a thermal interface material (TIM) (not shown) may be interposed between the shielding layer 150 and the heat sink 190. The heat to be conducted through the shielding layer 150 may be emitted to the outside of the semiconductor device 110E through the heat sink 190. In a case where the shielding layer 150 exposes a portion of the semiconductor chip 110, it may be configured to directly contact the exposed portion of the semiconductor chip 110. Accordingly, the heat dissipating efficiency of the semiconductor chip 110 is improved, thereby improving the dissipating characteristic of the semiconductor device 110E.

Figure 6A:
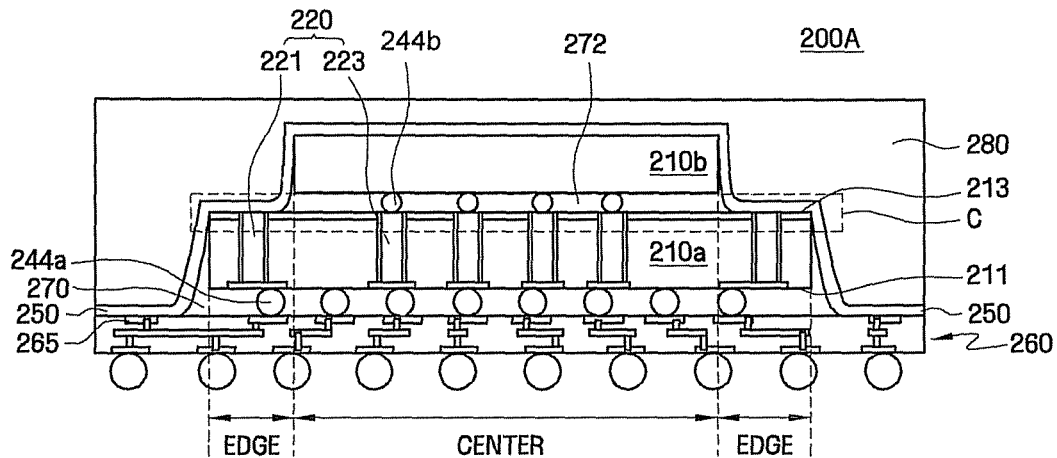
FIGS. 6A to 7B are cross-sectional views and partially plan views of a semiconductor device according to example embodiments of the present invention.
Figure 6B:
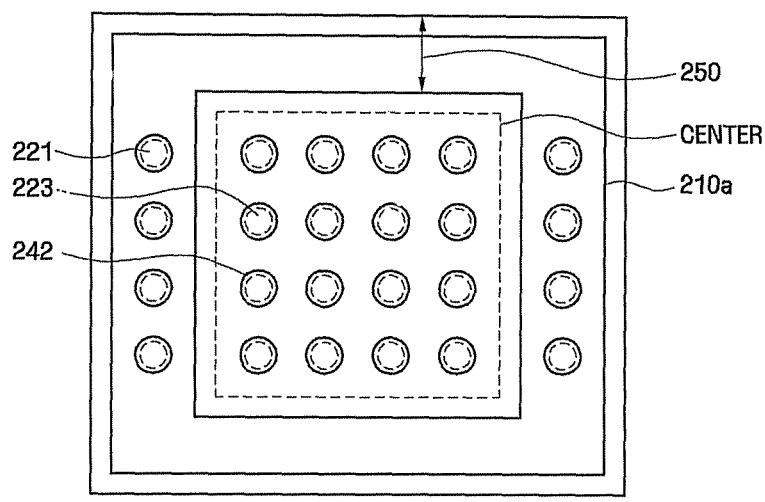

FIG. 6A is a cross-sectional view of a semiconductor device according to example embodiments of the present invention and FIG. 6B is a partially plan view of a portion 'C' of FIG. 6A.

Referring to FIGS. 6A and 6B, the semiconductor device 200A may include a first semiconductor chip 210a having a through via 220, a second semiconductor chip 210b stacked on the first semiconductor chip 210a, and a shielding layer 250 electrically connected to the through via 220. The first semiconductor chip 210a and the second semiconductor chip 210b may be mounted sequentially on the carrier substrate 260. The first semiconductor chip 210a, the carrier substrate 260 and the shielding layer 250 may have configurations that are the same as or similar to those of the semiconductor chip 110, the carrier substrate 160 and the shielding layer 150 shown in FIGS. 1A to 5.

The first semiconductor chip 210a and the second semiconductor chip 210b may be mounted on one plane of the carrier substrate 260. The first semiconductor chip 210a may include a first surface 211 and a second surface 213 that is different from the first surface 211. For example, the first surface 211 may be an active surface where an integrated circuit (not shown) is disposed, and the second surface 213 may be a back surface that is opposite to the first surface 211. The first semiconductor chip 210a is mounted flip-chip or face-down on the carrier substrate 260 such that the first surface 211 faces the carrier substrate 260. The second semiconductor chip 210b may be stacked on the second surface 213. In a case where the second semiconductor chip 210b is mounted face-down on the carrier substrate 260, a conductor means 244a may be interposed between the first semiconductor chip 210a and the carrier substrate 260.

Alternatively, the second surface 213 may be mounted face-up on the carrier substrate 260, and the second semiconductor chip 210b may be stacked on the first surface 211. In a case where the second semiconductor chip 210b is face-up mounted, the first semiconductor chip 210a may be connected to the carrier substrate 260 through a bonding wire (not shown).

A first passivation member 270 may be interposed between the carrier substrate 260 and the first semiconductor chip 210a. The first semiconductor chip 210a may include a first through via 221 and a second through via 223. The first through via 221 and the second through via 223 may receive voltages of different levels. For example, the first through via 221 may receive a ground voltage and the second through via 223 may receive a signal voltage. The first through via 221 is electrically connected to the shielding layer 250 to transmit the ground voltage to the shielding layer 250. The second through via 223 is electrically connected to the second semiconductor chip 210b to transmit a signal or power necessary for operation of the second semiconductor chip 210b to the second semiconductor chip 210b. For example, the first semiconductor chip 210a may be a logic chip including a memory control circuit, and the second semiconductor chip 210b may be a wide input/output memory chip including a memory circuit. The second semiconductor chip 210b may receive a control signal from the first semiconductor chip 210a through the second through via 223 or receive power from the carrier substrate 260.

The first through via 221 may be disposed at an edge region EDGE of the first semiconductor chip 210a. The edge region EDGE may be a region not overlapping the region where the second semiconductor chip 210b is stacked, so that the first through via 221 may not overlap the second semiconductor chip 210b and may be exposed by the second semiconductor chip 210b. For example, the edge region EDGE may be a region other than the region where the second semiconductor chip 210b is stacked. Since the edge region EDGE is not covered by the second semiconductor chip 210b even after the second semiconductor chip 210b is stacked, the first through via 221 may be exposed. The first through via 221 may be electrically connected to the shielding layer 250 through its exposed portion. The second through via 223 may be disposed at a central region CENTER of the first semiconductor chip 210a. At least a portion of the central region CENTER may overlap the region where the second semiconductor chip 210b is stacked. Accordingly, the second through via 223 may overlap the second semiconductor chip 210b. The second through via 223 may be electrically connected to the second semiconductor chip 210b through the conductor means 244b interposed between the first semiconductor chip 210a and the second semiconductor chip 210b. The conductor means 244b may be perpendicularly aligned with the second through via 223. In a case where the conductor means 244b is not aligned with the second through via 223, it may be electrically connected to the second through via 223 through a redistribution layer (not shown) formed on the second surface 213.

A connection pad 242 may be formed on the first through via 221 and the second through via 223. The connection pad 242 may be aligned with the first and second through vias 221 and 223 or may be connected to the first and second through vias 221 and 223 through the redistribution layer. The conductor means 244b may be aligned on the connection pad 242.

A second passivation member 272 may be formed between the first semiconductor chip 210a and the second semiconductor chip 210b. For example, the second passivation member 272 may include an underfill material. The second passivation member 272 may not cover the first through via 221 while covering the second through via 223 and/or the conductor means 244b.

The shielding layer 250 may cover at least a portion of the first semiconductor chip 210a, the second semiconductor chip 210b, and/or the carrier substrate 260. For example, as shown in FIG. 6A, the shielding layer 250 may cover all of top and lateral surfaces of the second semiconductor chip 210b. Alternatively, the shielding layer 250 may cover the lateral surfaces of the first semiconductor chip 210a and the second semiconductor chip 210b while exposing the top surface of the second semiconductor chip 210b. In addition, the shielding layer 250 may cover at least a portion of the carrier substrate 260. For example, as shown in FIGS. 3A and 3B, the shielding layer 250 may be electrically connected to an additional bonding pad 265 of the carrier substrate 260. Alternatively, as shown in FIG. 4, the shielding layer 250 may cover the lateral surface of the carrier substrate 260.

The molding portion 280 may cover at least portions of the carrier substrate 260, the first semiconductor chip 210a, and the second semiconductor chip 210b.

Figure 7A:
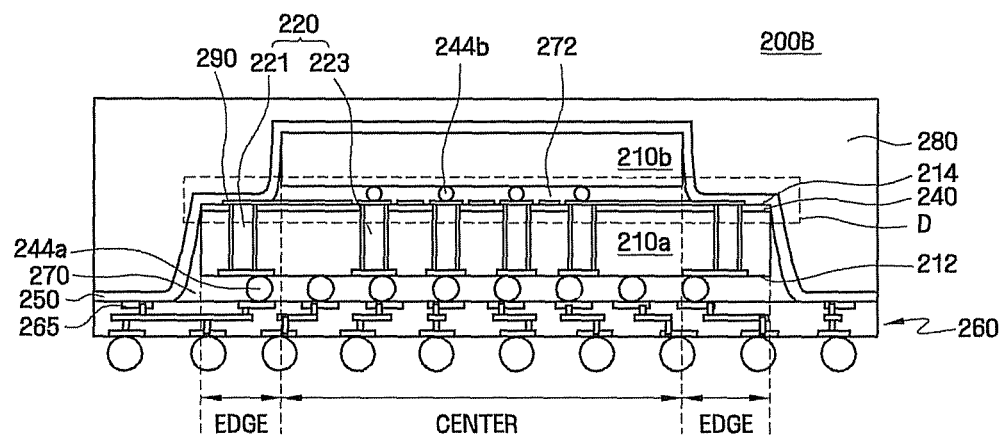
Figure 7B:
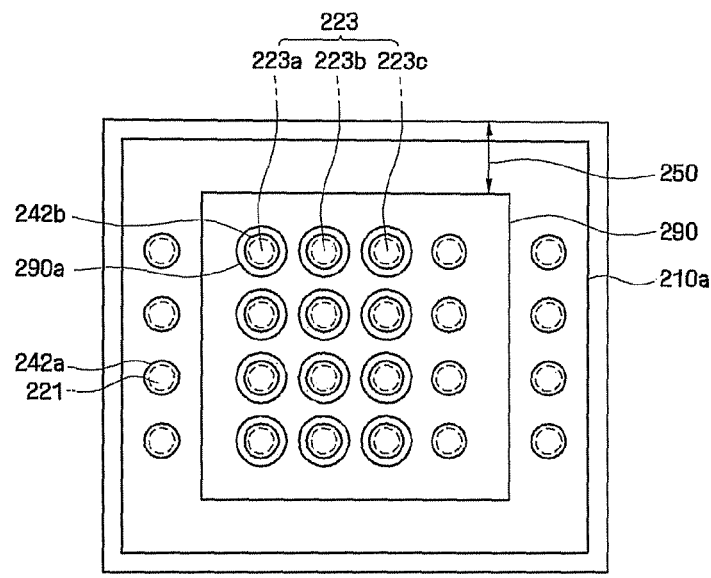

FIG. 7A is a cross-sectional view of a semiconductor device according to example embodiments of the present invention, and FIG. 7B is a partially plan view of a portion 'D' of FIG. 7A. The following description will focus on differences between the illustrated semiconductor device and the semiconductor device shown in FIGS. 6A and 6B.

Referring to FIGS. 7A and 7B, the semiconductor device 200B may further include a redistribution layer 290 provided between a first semiconductor chip 210a and a second semiconductor chip 210b. For example, the redistribution layer 290 may be a conductive pattern disposed on an insulation layer 240 of the first semiconductor chip 210a.

The first semiconductor chip 210a may include a first through via 221 and a second through via 223. The first through via 221 may be disposed in an edge region EDGE not overlapping the first semiconductor chip 210a to be electrically connected to the shielding layer 250. That is to say, the first through via 221 may be exposed by the second semiconductor chip 210b while not overlapping the second semiconductor chip 210b. The second through via 223 may include a signal via 242a that transmits a signal voltage necessary for operation of the second semiconductor chip 210b, a power via 242b that transmits a power voltage, and a ground via 242c that transmits a ground voltage. Arrangement of the signal via 242a, the power via 242b and the ground via 242c may vary according to functions of the first and second semiconductor chips 210a and 210b and disposition of internal circuits.

The redistribution layer 290 may be electrically connected to the first through via 221. For example, the redistribution layer 290 may contact a connection pad 242 formed in the first through via 221. The redistribution layer 290 receives the ground voltage through the first through via 221, thereby intercepting electromagnetic interference (EMI) between the first semiconductor chip 210a and the second semiconductor chip 210b. The redistribution layer 290 may be electrically insulated from the second through via 223. For example, the redistribution layer 290 may include a plate-shaped conductive pattern surrounding the connection pad 242 formed on the second through via 223 or the second through via 223. In a case where the ground voltage supplied to the second semiconductor chip 210b and the ground voltage transmitted through the first through via 221 have different paths, the redistribution layer 290 may further include an opening (not shown) surrounding the ground via 223c. Alternatively, in a case where the ground voltage supplied to the second semiconductor chip 210b and the ground voltage transmitted through the first through via 221 are supplied through paths that are electrically connected to each other, the redistribution layer 290 may be electrically connected to the first through via 221 and the ground via 244c. The configuration of the redistribution layer 290 is not limited to the illustrated example, and the redistribution layer 290 may be disposed in various manners to effectively intercept the EMI between the first semiconductor chip 210a and the second semiconductor chip 210b.

The shielding layer 250 may be connected to the first through via 221 through the redistribution layer 290. In a case where a passivation layer (not shown) covering the redistribution layer 290 is formed, the passivation layer may expose at least a portion of the redistribution layer 290. The redistribution layer 290 may be electrically connected to the shielding layer 250 through its exposed portion.

Figure 8:
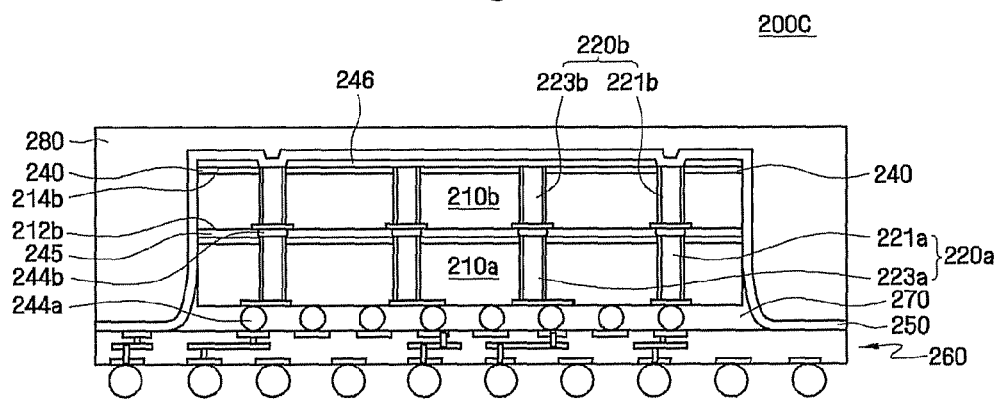
FIG. 8 is a cross-sectional view of a semiconductor device according to example embodiments of the present invention.

FIG. 8 is a cross-sectional view of a semiconductor device according to example embodiments of the present invention.

Referring to FIG. 8, the semiconductor device 200C may include a plurality of semiconductor chips stacked on one plane of a carrier substrate 260. For example, the semiconductor device 200C may include a first semiconductor chip 210a and a second semiconductor chip 210b stacked on the first semiconductor chip 210a. The first semiconductor chip 210a and the second semiconductor chip 210b may be semiconductor chips 110 of the same or similar type. For example, the first semiconductor chip 210a and the second semiconductor chip 210b may be memory chips of the same type, which have the same size. In a case where the semiconductor device 200C includes three or more semiconductor chips, the second semiconductor chip 210b may be a semiconductor chip disposed farthest from the carrier substrate 260. That is to say, the second semiconductor chip 210b may be a topmost semiconductor chip. A conductor means 244b or an adhesive layer 245 may be interposed between each of the stacked semiconductor chips 210a and 210b.

The first and second semiconductor chips 210a and 210b may include one or more through vias 220a and 220b, respectively. For example, the first semiconductor chip 210a may include a first through via 221a and a second through via 223a, and the second semiconductor chip 210b may include a third through via 221b and a fourth through via 223b. The first and third through vias 221a and 221b may transmit a ground voltage. The ground voltage transmitted through the first and third through vias 221a and 221b may be the same as or different from a ground voltage necessary for operation of the second semiconductor chip 210b. The second and fourth through vias 223a and 223b may transmit a signal or power necessary for operation of the second semiconductor chip 210b. The third and fourth through vias 221b and 223b may be perpendicularly aligned with the first and second through vias 221a and 223a.

The shielding layer 250 may be electrically connected to the through via 220b. For example, the shielding layer 250 is electrically connected to the third through via 221b and receives a ground voltage. The shielding layer 250 may cover at least a portion of the semiconductor chips 210a and 210b and the carrier substrate 260.

An insulation layer 246 covering at least a portion of the second semiconductor chip 210b may be interposed between the second semiconductor chip 210b and the shielding layer 250. The second semiconductor chip 210b may include a first surface 212b that faces the first semiconductor chip 210a, and a second surface 214b opposite to the first surface 212b. The insulation layer 246 exposing the through via 220b may be formed on the second surface 214b. The insulation layer 246 may be disposed on the second surface 214b and may cover a fourth through via 223b while exposing a third through via 221b. The third through via 221b may be electrically connected to the shielding layer 250 through a portion exposed by the insulation layer 246. The fourth through via 223b may be electrically insulated from the shielding layer 250 by means of the insulation layer 246. An electrical connection between the through vias 221b and 223b transmitting different signals or power can be prevented by forming the insulation layer 246.

Figure 9:
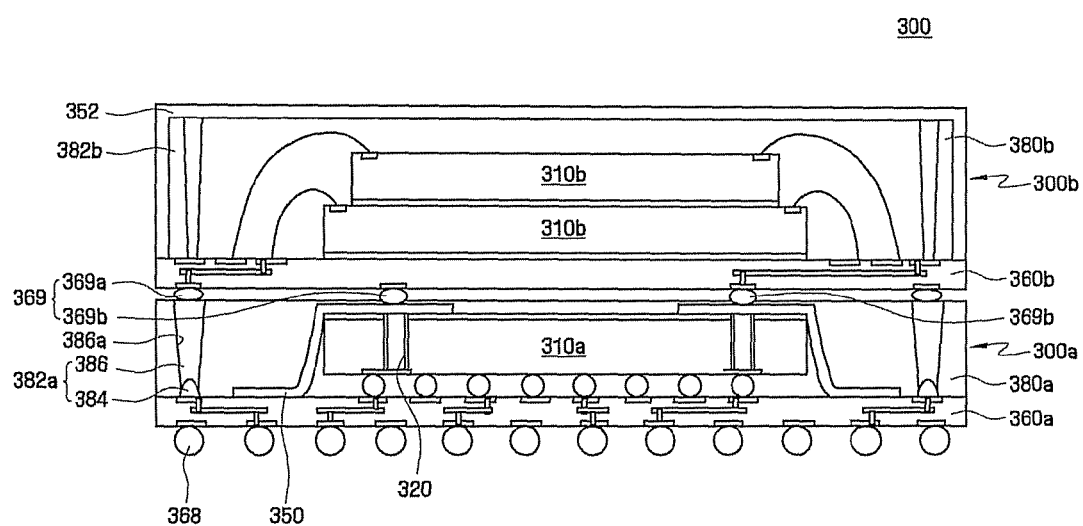
FIG. 9 is a cross-sectional view of a semiconductor device according to example embodiments of the present invention.

FIG. 9 is a cross-sectional view of a semiconductor device 300 according to example embodiments of the present invention.

Referring to FIG. 9, the semiconductor device 300 may include a plurality of semiconductor packages stacked. At least one of the plurality of semiconductor packages may include the semiconductor device having the configuration shown in FIGS. 1 to 8. For example, the semiconductor device 300 may include a first semiconductor package 300a and a second semiconductor package 300b stacked one on the other.

The first semiconductor package 300a may include a first carrier substrate 360a, a first semiconductor chip 310a mounted on one plane of the first carrier substrate 360a, and a first shielding layer 350 covering at least a portion of the first semiconductor chip 310a and electrically connected to a through via 320. The first carrier substrate 360a, the first semiconductor chip 310a and the first shielding layer 350 may have configurations that are the same as or similar to those of the carrier substrate 160, the semiconductor chip 110 and the shielding layer 150 shown in FIG. 1A.

The first semiconductor package 300a includes a first molding portion 380a covering the first semiconductor chip 310a and at least a portion of the first carrier substrate 360a, and a first molding through via 382a penetrating at least a portion of the first molding portion 380a. The first molding through via 382a penetrates the first molding portion 380a and electrically connects the first carrier substrate 360a to the second semiconductor package 300b. The first molding through via 382a may include a plurality of conductors stacked one on another. For example, the first molding through via 382a may include a first conductor 384 on the first carrier substrate 360a, and a second conductor 386 mounted on the first conductor 384 and exposed to the outside of the first molding portion 380a.

The first molding through electrode 382a may be formed in the following manner. The first conductor 384 is formed on the first carrier substrate 360a, and the first molding portion 380a covering the first conductor 384 is formed. Next, the first molding portion 380a is partially cut to form a through hole 386a exposing the first conductor 384, and the through hole 386a is then filled with a conductive material to form the second conductor 386.

The first carrier substrate 360a may further include a first connector means 368 for connecting the semiconductor device 300 to an external device.

The second semiconductor package 300b may include a second carrier substrate 360b, and a second molding portion 380b covering at least one second semiconductor chip 310b mounted on the second carrier substrate 360b, the second carrier substrate 360b and at least a portion of the second semiconductor chip 310b. The second semiconductor chip 310b may be flip-chip or wire-bonding mounted on the second carrier substrate 360b.

A second shielding layer 352 covering at least a portion of the second molding portion 380b may be formed. For example, the second shielding layer 352 may be a shielding can including a metal layer or a soft ferrite material layer. The shielding can may be attached to the second molding portion 380b through an adhesive layer (not shown).

The second semiconductor package 300b may include a second molding through electrode 382b penetrating at least a portion of the second molding portion 380b. The second carrier substrate 360b and the second shielding layer 352 may be electrically connected to each other through the second molding through electrode 382b. The second shielding layer 352 may receive a ground voltage through the second molding through electrode 382b. The second molding through electrode 382b may have a configuration that is the same as or similar to that of the first molding through electrode 382a. The second shielding layer 352 may prevents an interference signal generated from the second semiconductor chip 310b from being emitted to the outside of the second semiconductor package 300b, and may improve EMI from an adjacent semiconductor device.

A second connector means 369 may be disposed between the first semiconductor package 300a and the second semiconductor package 300b. One second connector means 369a may be connected to the first molding through via 386a, and the other second connector means 369b may be connected to the first shielding layer 350. The second connector means 369b connected to the first shielding layer 350 may be electrically connected to the second semiconductor chip 310b or the second molding through electrode 382b through the second carrier substrate 360b.

The configuration of the second semiconductor package 300b is not limited to the illustrated example and the second semiconductor package 300b may be a semiconductor package formed in various manners. For example, the second semiconductor package 300b may have a configuration that is the same as or similar to that of the first semiconductor package 300a.

The signal or power necessary for operation of the second semiconductor chip 210b may be supplied through different paths. For example, a signal or power voltage may be transmitted from the first carrier substrate 360a to the second semiconductor chip 310b through the first molding through via 382a, the second connector means 369a and the second carrier substrate 360b. The ground voltage may be transmitted from the first carrier substrate 360a to the second semiconductor chip 310b through the first shielding layer 350, the second connector means 369b and the second carrier substrate 360b. Therefore, the size of the semiconductor device 300 can be reduced or the diameter of the first molding through via 382a can be increased by reducing the number of the first molding through via 382a, thereby improving the processing reliability.

FIGS. 10A to 10D are cross-sectional views illustrating a fabrication method of a semiconductor device according to example embodiments of the present invention.

Figure 10A:
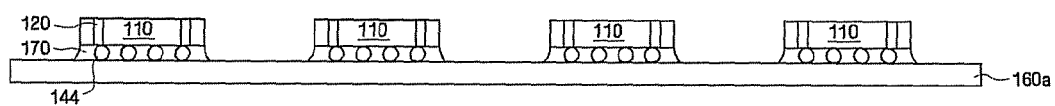
FIGS. 10A to 10D are cross-sectional views illustrating a fabrication method of a semiconductor device according to example embodiments of the present invention.

Referring to FIG. 10A, semiconductor chips 110 are mounted on a carrier substrate 160a. The semiconductor chips 110 include through vias 120 and may be flip-chip mounted on the carrier substrate 160a. The carrier substrate 160a and the semiconductor chips 110 may be electrically connected to each other by conductor means 144. A passivation member 170 covering the conductor means 144 may be formed between the carrier substrate 160a and the semiconductor chips 110.

Figure 10B:
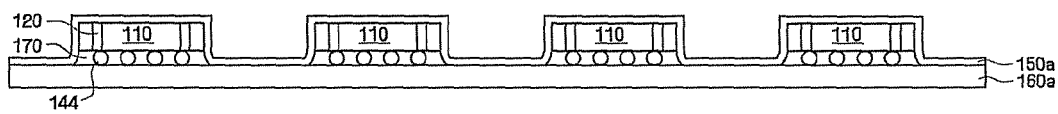

Referring to FIG. 10B, a shielding layer 150a may be formed to cover at least portions of the semiconductor chips 110. For example, in a case where the shielding layer 150a is supplied in a liquid type, it may be coated on the semiconductor chips 110 by painting or spraying. Alternatively, in a case where the shielding layer 150a is supplied in a tape or can type, it may be attached to the semiconductor chips 110 using an adhesive layer (174 of FIG. 2). If there is a portion that should not contact the shielding layer 150a, an insulation layer (346 of FIG. 8) may be formed before forming the shielding layer 150a, the shielding layer 150a may not be formed in the corresponding portion using a mask (not shown) covering the corresponding portion, or the corresponding portion may removed after forming the shielding layer 150a.

Figure 10C:
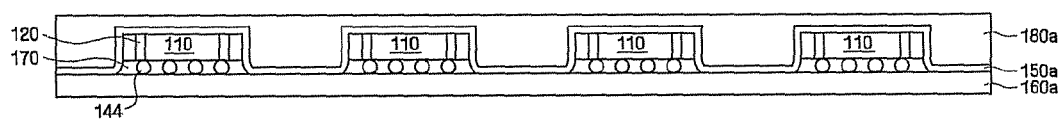
Figure 10D:
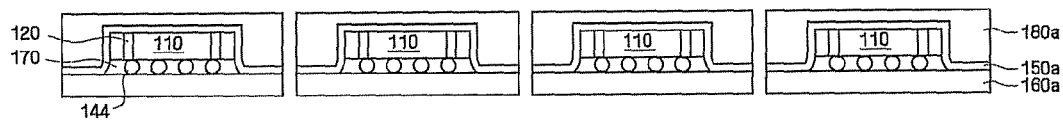

Referring to FIGS. 10C and 10D, a molding portion 180a covering the shielding layer 150a is formed and scribed into individual semiconductor devices. Each of the individual semiconductor devices may have a configuration that is the same as that of the semiconductor device shown in FIGS. 1A to 7A.

FIGS. 11A to 11H are cross-sectional views illustrating through vias and a fabrication method of a semiconductor device shown in FIG. 6A.

FIGS. 11A to 11D illustrate a method of forming through vias 220 included in the semiconductor device 200A shown in FIG. 6A. The method of forming through vias 220 shown in FIGS. 11A to 11D may be applied to a case of forming through vias included in a semiconductor device according to example embodiments.

Figure 11A:
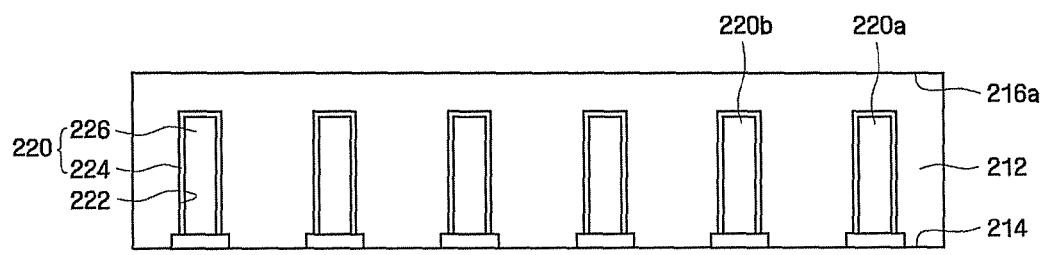
FIGS. 11A to 11H are cross-sectional views illustrating a fabrication method of a semiconductor device according to example embodiments of the present invention.

Referring to FIG. 11A, the through vias 220 penetrating at least portions of the semiconductor substrate 212 may be formed. The through vias 220 may include a first through vias 220a and a second through vias 220b. The first through vias 220a and the second through vias 220b may be divided according to the area of the semiconductor substrate 212 where they are disposed, and the level of voltage transmitted. The first through vias 220a and the second through vias 220b may be simultaneously formed in the following manner.

The through vias 220 may be formed to penetrate at least portions of the semiconductor substrate 212 from a first surface 214 to an initial-stage second surface 216a. A via hole 222 is formed by etching the semiconductor substrate 212, and a via insulation layer 224 and a via electrode 226 may be formed in the inner surface of the via hole 222. The via insulation layer 224 may include a silicon oxide film and may be formed by oxidizing the semiconductor substrate 212 or depositing an insulating material on the semiconductor substrate 212. The via electrode 226 may include Ag, Au, Cu, W or In and may be formed by depositing or plating. A barrier layer (not shown) may be formed after forming the via insulation layer 224 and before forming the via electrode 226. The barrier layer may include Ti, TiN, Ta, or TaN. The through vias 220 may be formed in an area without an integrated circuit (not shown) or a scribe lane.

Figure 11B:
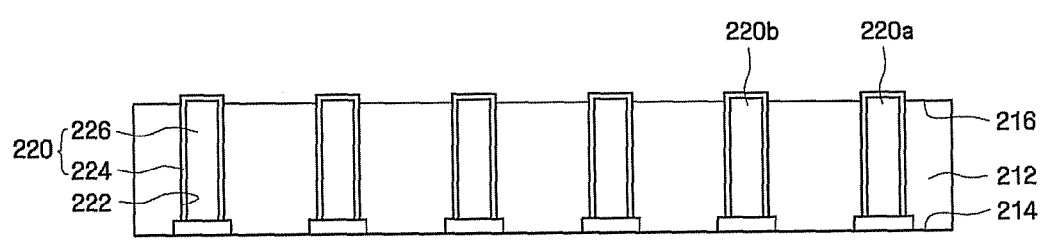

Referring to FIG. 11B, the initial-stage second surface 216a of the semiconductor substrate 212 may be removed to expose the via insulation layer 224. The initial-stage second surface 216a may be removed by, for example, chemical mechanical polishing (CMP) or etching. The second surface 216 formed by removing the initial-stage second surface 216a may be lower than the via insulation layer 224. That is to say, the through vias 220 may protrude higher than the second surface 216.

For example, the first surface 214 may be an active surface on which the integrated circuit (not shown) is disposed, and the second surface 216 may be a back surface which is opposed to the first surface 214. In a case where the through vias 220 are formed in a via first type (see FIG. 1B), the integrated circuit may be formed after forming the through vias 220. Alternatively, in a case where the through vias 220 are formed in a via middle type (see FIG. 1C), the through vias 220 may be formed to penetrate an interlayer dielectric layer (e.g., 138 of FIG. 1C) and the semiconductor substrate 212 in the middle of forming the integrated circuit. Alternatively, in a case where the through vias 220 are formed in a via last type (see FIG. 1D), the through vias 220 may be formed from the second surface 216 to the first surface 214 after forming the integrated circuit.

Figure 11C:
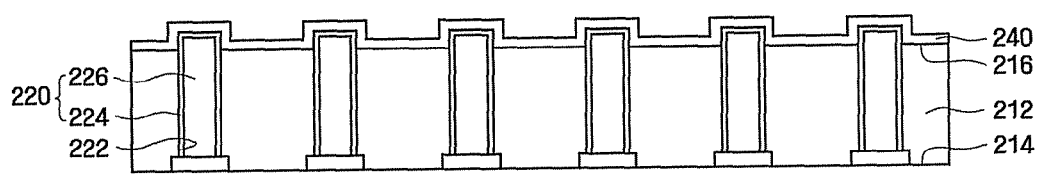

Referring to FIG. 11C, a back surface insulation layer 240 may be formed on the second surface 216 of the semiconductor substrate 212. The back surface insulation layer 240 may include at least one of silicon oxide, silicon nitride, silicon oxynitride, and combinations thereof. The back surface insulation layer 240 may include a plurality of insulation films. For example, the back surface insulation layer 240 may include a silicon oxide film and a silicon nitride film sequentially stacked on the second surface 216. The back surface insulation layer 240 may be formed by chemical vapor deposition. The back surface insulation layer 240 may prevent the semiconductor substrate 212 from being contaminated by a conductive material forming the via electrode 226 during a subsequent exposure process of the via electrode 226. Alternatively, the back surface insulation layer 240 may prevent the voltage level supplied to the shielding layer 250 from affecting the operation of the semiconductor chip 210a by electrically insulating the shielding layer 250 from the semiconductor substrate 212.

Figure 11D:
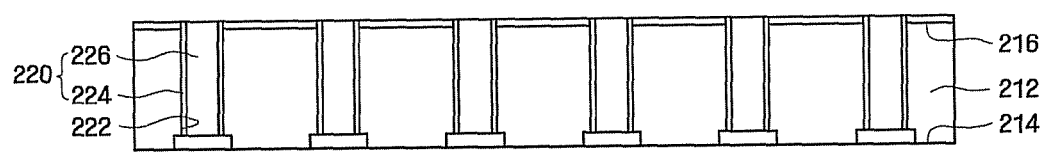

Referring to FIG. 11D, the back surface insulation layer 240 and the via insulation layer 224 may be partially removed to expose the via electrode 226. The back surface insulation layer 240 and the via insulation layer 224 may be removed by, for example, CMP.

Figure 11E:
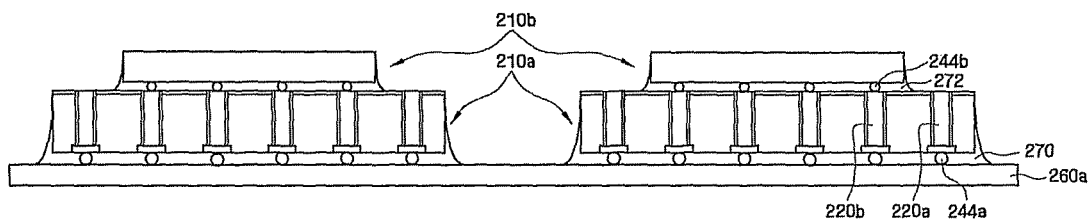

FIGS. 11E to 11H illustrate a method of forming the semiconductor device 200A shown in FIG. 6A. Referring to FIG. 11E, the first semiconductor chip 210a and the second semiconductor chip 210b are mounted on a carrier substrate 260a. The first semiconductor chip 210a is mounted on one plane of the carrier substrate 260a through a first conductor means 244a, and a first passivation member 270 covering the first conductor means 244a may be formed. For example, the first passivation member 270 may cover at least a portion of the semiconductor substrate 212 exposed to the lateral surface of the first semiconductor chip 210a. The first semiconductor chip 210a may include through vias 220 formed by the method illustrated in FIGS. 11A to 11D.

The second semiconductor chip 210b may be stacked on the first semiconductor chip 210a through the second conductor means 244b. For example, the second semiconductor chip 210b may be smaller than the first semiconductor chip 210a. Therefore, the second semiconductor chip 210b may not cover the first through vias 220a formed in an edge region (EDGE of FIG. 6A) of the first semiconductor chip 210a and may not overlap the first through vias 220a. That is to say, the first through vias 220a may not overlap the second semiconductor chip 210b and may be exposed by the second semiconductor chip 210b. A second passivation member 272 may be formed between the first semiconductor chip 210a and the second semiconductor chip 210b. The second passivation member 272 may be formed to cover the second conductor means 244b while not covering the first through vias 220a. Alternatively, the first and second semiconductor chips 210a and 210b may first be attached to each other, and the stacked first and second semiconductor chips 210a and 210b may then be mounted on the carrier substrate 260a.

Figure 11F:
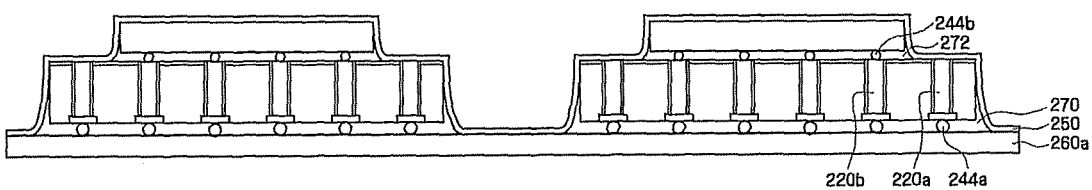
Figure 11G:
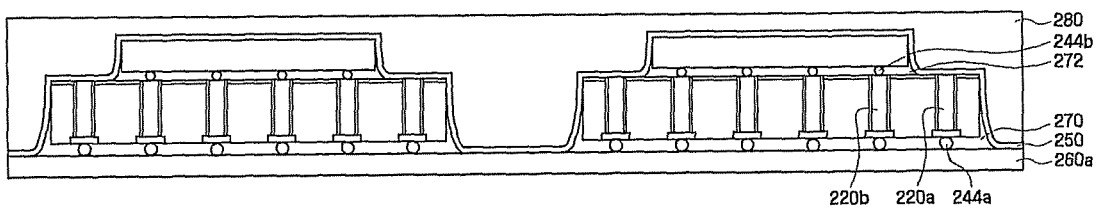
Figure 11H:
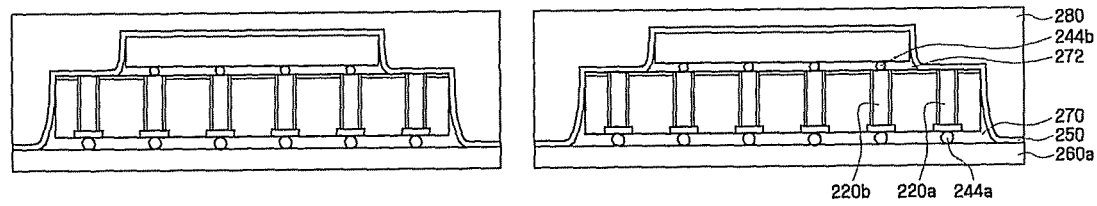

Referring to FIGS. 11F to 11H, after forming a shielding layer 250 and a molding portion 280, the first and second semiconductor chips 210a and 210b may be cut into individual semiconductor devices, thereby forming the semiconductor devices shown in FIGS. 6A and 7A. The shielding layer 250 and the molding portion 280 may be formed by a method that is the same as or similar to that shown in FIGS. 10A and 10C.

According to example embodiments, first through vias 220a for supplying a ground voltage to the shielding layer 250 or second through vias 220b for supplying a signal or power to the second semiconductor chip 210b may be simultaneously formed. Therefore, the first through vias 220a can be fanned without an additional process.

Figure 12A:
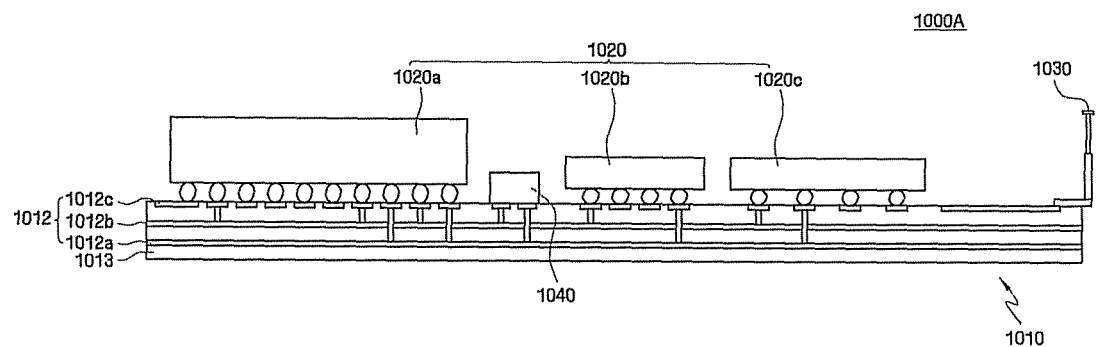
FIGS. 12A and 12B are cross-sectional views of semiconductor module including semiconductor devices according to example embodiments of the present invention.
Figure 12B:
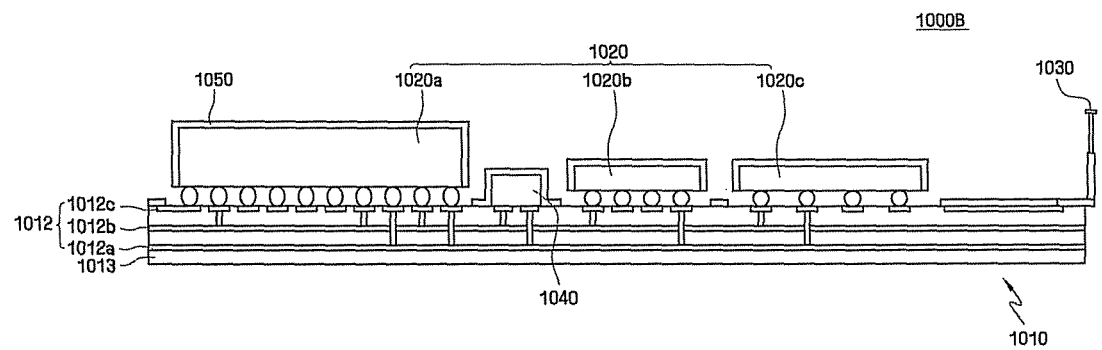

FIGS. 12A and 12B are cross-sectional views of semiconductor module including semiconductor devices according to several embodiments of the present invention.

The semiconductor module is mounted in an electronic device for operation.

Referring to FIG. 12A, the semiconductor module 1000A may include a system board 1010 and a plurality of semiconductor packages 1020 mounted on the system board 1010. The system board 1010 may include, for example, a printed circuit board (PCB). The system board 1010 may include one or more conductive layers 1012 and an insulation layer 1013 disposed between the conductive layers 1012. For example, the one or more conductive layers 1012 may include a ground layers 1012a transmitting a ground voltage, a power layers 1012b transmitting a power voltage, and a signal layers 1012c transmitting a signal voltage. The conductive layers 1012 may include a circuit pattern. The plurality of semiconductor packages 1020 may perform different functions. For example, the plurality of semiconductor packages 1020 may include a central processing unit (CPU) 1020a, a modem 1020b, a radio frequency (RF) chip 1020c, and a power supply. The semiconductor module 1000A may include an antenna 1030 connected to at least one of the semiconductor packages 1020. The semiconductor module 1000A may communicate with the outside through the antenna 1030. For example, the RF signal received through the antenna 1030 is transmitted to the modem 1020b through the RF chip 1020c, and is modulated into an operating frequency in the modem 1020b to then be transmitted to the CPU 1020a. The CPU 1020a may operate other semiconductor packages for operating an electronic device.

At least one of the semiconductor packages 1020 may include semiconductor devices according to example embodiments of the present invention. For example, the CPU 1020a may include the semiconductor device 200A shown in FIG. 6A. Since the semiconductor device 200A includes the shielding layer 250, EMI with other adjacent semiconductor packages 1020a and 1020b can be interrupted. Therefore, the operating characteristics of the respective semiconductor packages 1020a, 1020b and 1020c can be improved. In addition, since the interference signal can be prevented from being emitted to the outside of the semiconductor packages 1020, the signal transmitting/receiving sensitivity through the antenna 1030 can be improved.

The semiconductor module 1000A may further include a passive device 1040 mounted on the system board 1010. The passive device 1040 may be, for example, a decoupling capacitor.

Referring to FIG. 12B, the semiconductor module 1000B may include a module level shielding layer 1050. The module level shielding layer 1050 may cover at least a portion of the semiconductor packages 1020 or the system board 1010. In addition, although not shown, the module level shielding layer 1050 may be electrically connected to the ground layer 1012a of the system board 1010. For example, the module level shielding layer 1050 may be formed by a method that is the same as or similar to the shielding layer 150a shown in FIG. 10B. In a case where the module level shielding layer 1050 is coated on the semiconductor module 1000B by painting or spraying, the module level shielding layer 1050 may be formed by the method shown in FIG. 12B.

Figure 13:
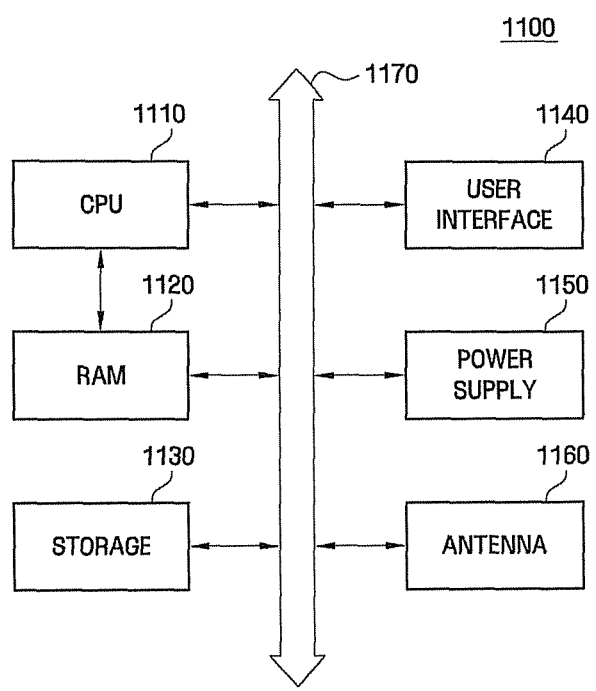
FIG. 13 is a block diagram of an electronic system including a semiconductor device according to example embodiments of the present invention.

FIG. 13 is a block diagram of an electronic system including a semiconductor device according to example embodiments of the present invention.

Referring to FIG. 13, the electronic system 1100 may include a CPU 1110, a random access memory (RAM) 1120, a storage unit 1130, a user interface 1140, a power supply 1150, an antenna 1160, and a bus 1170.

The CPU 1110 controls operations of the electronic system 1100. The CPU 1110 communicates with an external device through the antenna 1160, and may receive control signals from the external device, such as a host. For example, the CPU 1110 may communicate with the external device through a variety of interface protocols, including serial advanced technology attachment (SATA), parallel ATA (PATA), universal serial bus (USB), multimedia card (MMC), small computer system interface (SCSI), enhanced small disk interface (ESDI), and integrated drive electronics (IDE).

The RAM 1120 may store data input/output to/from the CPU 1110. For example, the RAM 1120 may include a relatively high-speed synchronous DRAM (SRAM). The CPU 1110 and the RAM 1120 may be included in one semiconductor device, like the semiconductor device 200A shown in FIG. 6A.

The storage unit 1130 may include a nonvolatile memory for supplying a storage space of the electronic system 1100. The storage unit 1130 may include, for example, a data or code storage memory. In a case where the storage unit 1130 includes a code storage memory, the electronic system 1100 may operate in itself without an input from host.

The CPU 1110, the RAM 1120, the storage unit 1130, and the power supply 1150 may be supplied in the form of a semiconductor package. The semiconductor package including the CPU 1110, the RAM 1120 or the storage unit 1130 may have configurations of the semiconductor devices according to example embodiments of the present invention. The shielding layer (e.g., 250 of FIG. 6A) included in the semiconductor device may interrupt EMI with other semiconductor devices. Therefore, operating characteristics of the respective semiconductor devices are improved and the performance of the electronic system 1100 is improved accordingly. In addition, in a case where the semiconductor device includes a heat sink, not only EMI but also the heat generated during the operation of the semiconductor devices are emitted to the outside, thereby improving the operating reliability.

The user interface 1140 may perform an interfacing operation of converting a signal into one that can be easily recognized by a user for using the electronic system 1100. For example, the user interface 1140 may convert a user's input signal into a signal that can be recognized by the electronic system 1100 or convert the operation performed by the electronic system 1100 into a user's recognizable signal.

The antenna 1160 may transmit/receive data to/from an external device for the electronic system 1100 to perform wireless communication. In example embodiments of the present invention, interference signals emitted from a central processing unit 1110, an RAM 1120, a storage unit 1130, a power supply 1150, etc. included in the electronic system 1100 are blocked by the shielding layer 150, thereby improving signal transmitting/receiving sensitivity through the antenna 1160.

The electronic system 1100 may further include application chipset, a camera image processor (CIS), or a mobile DRAM, etc. according to the application employed.

The embodiments of the present invention shown in FIGS. 1A to 13 can be applied to a variety of electronic devices.

Figure 14:
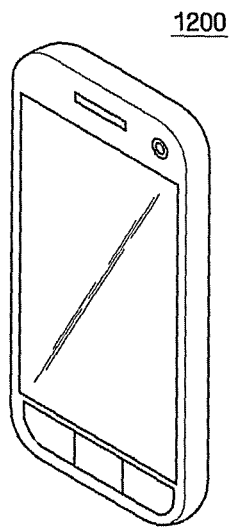
FIG. 14 illustrates an application of example embodiments of the present invention.

FIG. 14 illustrates an application example in which the present invention is applied to a mobile phone 1200. Additionally, various embodiments of the present invention can also be applied to a game machine, a portable notebook computer, a navigation device, an automotive vehicle, home appliance, and so on.

In the semiconductor devices according to example embodiments of the present invention, EMI with adjacent semiconductor devices can be reduced using a shielding layer covering at least portions of semiconductor chips and electrically connected to through vias, thereby improving operating reliability of the semiconductor devices. In addition, signal receiving sensitivity of an electronic device can be improved by intercepting an interruption signal emitted from the semiconductor devices.

While the present invention has been particularly shown and described with reference to example embodiments thereof, it will be understood by those of ordinary skill in the art that various changes in form and details may be made therein without departing from the spirit and scope of the present invention as defined by the following claims. It is therefore desired that the examples herein be considered in all respects as illustrative and not restrictive, with reference being made to the appended claims rather than the foregoing description to indicate the scope of the invention.

What is claimed is:

1. A semiconductor device comprising:
    a first semiconductor chip including a semiconductor substrate;
    a first through via penetrating the semiconductor substrate;
    a second semiconductor chip stacked on the first semiconductor chip; and
    a shielding layer conformally covering and directly contacting side walls of the first semiconductor chip and the second semiconductor chip, the shielding layer being electrically connected to the first through via.

2. The semiconductor device of claim 1, wherein the first through via is configured to transmit a ground voltage.

3. The semiconductor device of claim 1, wherein the first through via is disposed so as to not be overlapped by the second semiconductor chip.

4. The semiconductor device of claim 1, further comprising:
    a second through via penetrating the semiconductor substrate of the first semiconductor chip, the second through via disposed so as to be overlapped by the second semiconductor chip.

5. The semiconductor device of claim 4, wherein the first through via and the second through via are configured to transmit different signals.

6. The semiconductor device of claim 1, wherein the shielding layer includes a metallic material.

7. The semiconductor device of claim 6, wherein the metallic material includes a ferrite material.

8. The semiconductor device of claim 7, wherein the metallic material further includes at least one metal selected from the group consisting of nickel (Ni), zinc (Zn), manganese (Mn), cobalt (Co), magnesium (Mg), aluminum (Al), barium (Ba), and copper (Cu).

9. The semiconductor device of claim 1, further comprising:
    a passivation layer covering the shielding layer.

10. The semiconductor device of claim 1, further comprising:
    an insulation layer on the first semiconductor chip, the insulation layer directly contacting the shielding layer.

11. The semiconductor device of claim 1, further comprising:
    a redistribution layer disposed between the first semiconductor chip and the second semiconductor chip, the redistribution layer configured to receive a ground voltage.

12. The semiconductor device of claim 11, wherein the redistribution layer is electrically connected to the first through via.

13. The semiconductor device of claim 11, wherein the first semiconductor chip further includes a second through via penetrating the semiconductor substrate, and the redistribution layer is electrically insulated from the second through via.

14. The semiconductor device of claim 1, wherein the first semiconductor chip is a logic chip, and the second semiconductor chip is a memory chip.

15. The semiconductor device of claim 1, wherein the first and second semiconductor chips are mounted on a carrier substrate.

16. The semiconductor device of claim 15, wherein the first semiconductor chip is flip-chip mounted on the carrier substrate.

17. The semiconductor device of claim 15, further comprising:
    a passivation layer interposed between the carrier substrate and the first semiconductor chip.

18. The semiconductor device of claim 17, wherein the passivation layer includes an underfill material.

19. The semiconductor device of claim 15, wherein the shielding layer covers side surfaces of the first semiconductor chip and at least a portion of the carrier substrate.

20. The semiconductor device of claim 15, wherein the carrier substrate includes a ground pad, and the shielding layer is electrically connected to the ground pad.

21. The semiconductor device of claim 15, wherein the carrier substrate further includes a heat dissipating via disposed in a region not overlapped by the first semiconductor chip, and the shielding layer is electrically connected to the heat dissipating via.

22. The semiconductor device of claim 15, further comprising:
a passivation layer covering at least a portion of the shielding layer.

23. The semiconductor device of claim 22, further comprising:
a heat sink, the passivation layer exposing a surface of the shielding layer such that the heat sink contacts the exposed surface of the shielding layer.

24. A semiconductor device comprising:
a carrier substrate;
a first semiconductor chip mounted on the carrier substrate, the first semiconductor chip including a semiconductor substrate;
first and second through vias penetrating the semiconductor substrate;
a second semiconductor chip mounted on the first semiconductor chip, the second semiconductor chip being electrically connected to the second through via; and
a shielding layer covering at least one of the carrier substrate, the first semiconductor chip, and the second semiconductor chip, the shielding layer conformally covering and directly contacting side walls of the first semiconductor chip and the second semiconductor chip, the shielding layer being electrically connected to the first through via,
wherein the second semiconductor chip is smaller than the first semiconductor chip, and the first through via is disposed in a region not overlapped by the second semiconductor chip.

25. A semiconductor device comprising:
a first semiconductor chip, the first semiconductor chip including a first through via extending between opposing surfaces of the first semiconductor chip;
a second semiconductor chip stacked on the first semiconductor chip; and
a shielding layer conformally covering and directly contacting side walls of the first semiconductor chip and the second semiconductor chip, the shielding layer being electrically connected to the first through via.

26. The semiconductor device of claim 25, wherein the second semiconductor chip is not directly above the first through via.

27. The semiconductor device of claim 25, wherein the second semiconductor chip is disposed between adjacent pairs of first through vias.

28. The semiconductor device of claim 25, wherein the first semiconductor chip further includes a second through via, the second through via being electrically connected to the second semiconductor chip.

29. The semiconductor device of claim 25, wherein the shielding material includes Fe in the form of an oxide.

* * * * *